(12) United States Patent
Wang

(10) Patent No.: US 7,915,622 B2
(45) Date of Patent: Mar. 29, 2011

(54) TEXTURED LIGHT EMITTING DIODES

(75) Inventor: Wang Nang Wang, Bath (GB)

(73) Assignee: Nanogan Limited, Bath (GB)

( * ) Notice: Subject to any disclaimer, the term of this patent is extended or adjusted under 35 U.S.C. 154(b) by 186 days.

(21) Appl. No.: 11/576,151

(22) PCT Filed: Sep. 27, 2005

(86) PCT No.: PCT/GB2005/003704
§ 371 (c)(1),
(2), (4) Date: Feb. 9, 2009

(87) PCT Pub. No.: WO2006/035212
PCT Pub. Date: Apr. 6, 2006

(65) Prior Publication Data
US 2009/0159907 A1 Jun. 25, 2009

(30) Foreign Application Priority Data
Sep. 28, 2004 (GB) .................. 0421500.0

(51) Int. Cl.
*H01L 29/18* (2006.01)
(52) U.S. Cl. ........... 257/88; 257/93; 438/22; 438/33; 438/34; 438/38; 438/39
(58) Field of Classification Search .................. None
See application file for complete search history.

(56) References Cited

U.S. PATENT DOCUMENTS

| | | | |
|---|---|---|---|
| 6,576,533 B2 * | 6/2003 | Tomiya et al. | 438/481 |
| 6,734,030 B2 * | 5/2004 | Doi et al. | 438/22 |
| 6,828,591 B2 * | 12/2004 | Okuyama et al. | 257/89 |
| 6,881,982 B2 * | 4/2005 | Okuyama et al. | 257/91 |
| 6,921,924 B2 * | 7/2005 | Tsai et al. | 257/95 |
| 6,924,500 B2 * | 8/2005 | Okuyama et al. | 257/13 |
| 2003/0087467 A1 | 5/2003 | Oohata et al. | |
| 2003/0218179 A1 | 11/2003 | Koide et al. | |

FOREIGN PATENT DOCUMENTS

| | | |
|---|---|---|
| EP | 1 271 665 A3 | 10/2003 |
| EP | 1 422 748 A1 | 5/2004 |
| JP | 2004-193498 | 7/2004 |

OTHER PUBLICATIONS

UK Search Report dated Feb. 4, 2005, for corresponding U.K. Application No. GB 0421500.0, 3 pgs.

* cited by examiner

*Primary Examiner* — Zandra Smith
*Assistant Examiner* — Khanh B Duong
(74) *Attorney, Agent, or Firm* — Christie, Parker & Hale, LLP

(57) ABSTRACT

A high fill factor textured light emitting diode structure comprises: a first textured cladding and contact layer (2) comprising a doped III-V or II-VI group compound semiconductor or alloys of such semiconductors deposited by epitaxial lateral overgrowth (ELOG) onto a patterned substrate (1); a textured undoped or doped active layer (3) comprising a III-V or II-VI group semiconductor or alloys of such semiconductors and where radiative recombination of electrons aid holes occurs or intersubband transition occurs; and a second textured cladding and contact layer (4) comprising a doped III-V or II-VI group semiconductor or alloys of such semiconductors.

13 Claims, 4 Drawing Sheets

# TEXTURED LIGHT EMITTING DIODES

CROSS-REFERENCE TO RELATED APPLICATION(S)

The present application is the National Stage of International Application No. PCT/GB2005/003704, filed Mar. 27, 2005, which claims the benefit under 35 U.S.C. §119 of United Kingdom Application No. 0421500.0, filed Sep. 28, 2004, incorporated herein by reference in their entirety.

BACKGROUND OF THE INVENTION

1. Field of the Invention

The present invention relates to textured light emitting diodes (LEDs) producing visible, infrared or ultraviolet light. More particularly, the invention relates to highly efficient LED devices with enhanced fill factor for high light output.

2. Description of the Prior Art

Recent developments in the field of compound semiconductors have given rise to a new generation of light emitting diodes and lasers for the visible spectral range, particularly in III-V nitrides-based devices in the blue and green wavelength regions. The main advantage of nitride semiconductors in comparison with other wide band-gap semiconductors is their low degradation in optical devices. In recent years, enormous efforts have been made by companies to enter into the new house-lighting industry. The general idea is to replace conventional incandescent or fluorescent lamps by more reliable and compact semiconductor light sources—LED lamps. LED-based white appearance lighting aiming to replace conventional incandescent or fluorescent lamps could be produced by few methods: using phosphors for down conversion of blue or UV LEDs and using a combination of different wavelength LEDs (such as red, green and blue LEDs).

One of the key obstacles is the low luminous efficacy (lm/W) of LEDs, particularly in the blue and green wavelength regions. Current AlInGaP based red LEDs have achieved a luminous efficacy in the range around 60-80 lm/W, but blue and green LEDs have only reached around 20 lm/W. Current blue, green and white LEDs are grown on sapphire or SiC substrates. The high refractive index of GaN alloys and an LED structure with parallel light emitting active area can result in 80% of light being trapped within the GaN layer, only 20% exiting through the sapphire substrates and the top. These kind of problems also occurred in AlInGaP grown on GaAs.

To overcome this waveguiding effect induced by total internal reflection, most research efforts have been concentrated on changing the shape and surface texture of LED devices to break down total internal reflection, and consequently enhance the light extraction efficiency. Inverse truncated pyramid structures and roughened surfaces above the light emitting active layers have been commonly used in AlInGaP based red LEDs to improve the light extraction efficiency.

This invention of a textured LED structure is based on a novel approach in improving the light extraction efficiency from LEDs. The active area in conventional LED devices is a planar configuration, therefore the fill factor, the active light emitting area versus the chip size, is usually smaller than one for GaN grown on a sapphire substrate, or at most equal to one for GaN grown on an n-type SiC substrate or free standing n-GaN or for AlInGaP grown on GaAs. In the following examples, an LED structure is fabricated with a trench or convex textured structure to increase the fill factor of the surface active light emitting area and to break down internal reflection and to reduce absorption by compound semiconductors and their alloys. Hence a much higher light output power can be achieved by a textured LED.

PRIOR ART

Surface roughening—'Improved light-output and electrical performances of InGaN-based light-emitting diode by micro-roughening of p-GaN surface. C. Huh, K S Lee, E J Kang, and S J Park, J. Appl. Physics, 93(11), 9383-9385, 2003.

Changing the surface emitting angle: U.S. Pat. No. 6,768,136 'Radiation emitting structural element'.

SUMMARY OF THE INVENTION

It is an object of the present invention to provide a highly efficient textured LED structure with a fill factor more than one for high light output using III-V and II-VI group semiconductors.

A high fill factor textured light emitting diode structure comprising:

a first textured cladding and contact layer comprising a doped III-V or II-VI group compound semiconductor or alloys of such semiconductors deposited by epitaxial lateral overgrowth (ELOG) onto a substrate patterned with a plurality of regions from which said overgrowth is initiated such that said first textured cladding and said contact layer are continuous over said substrate;

a textured undoped or doped active layer comprising a III-V or II-VI group semiconductor or alloys of such semiconductors and where radiative recombination of electrons and holes occurs or intersubband transition occurs, the active layer being continuous over said first textured cladding and contact layer; and a second textured cladding and contact layer comprising a doped III-V or II-VI group semiconductor or alloys of such semiconductors.

According to the present invention from another aspect, there is provided a high fill factor textured light emitting diode structure comprising:

a textured n-cladding and contact layer comprising an n-type III-V or II-VI group compound semiconductor or alloys of such semiconductors deposited by epitaxial lateral overgrowth (ELOG) onto a substrate patterned with a plurality of regions from which said overgrowth is initiated such that said first textured cladding and said contact layer are continuous over said substrate;

a textured active layer comprising a III-V or II-VI group semiconductor or alloys of such semiconductors and where radiative recombination of electrons and holes occurs, the active layer being continuous over said first textured n-cladding and contact layer; and a textured hole emitting layer and p-type contact layer comprising a p-type III-V or II-VI group semiconductor or alloys of such semiconductors.

A structure according to the invention could comprise:

a conducting or insulating substrate;

a III-V or II-VI group compound semiconductor or alloys of such semiconductors deposited onto the substrate by HVPE, MOCVD, MBE, LPE, sublimation, sputtering or other appropriate deposition method; and a pattern on the substrate produced by a mask or maskless method comprising photolithography, direct writing using an electron beam or a focused ion beam, scanning tunneling microscopy, holography, nanoimprint, anodic porous alumina, wet etching or other patterning method or combined method.

The or each textured cladding and contact layer may be in the form of a single layer, multiple layers or superlattices.

The textured hole emitting layer and p-type contact layer may be in the form of a single layer, multiple layers or superlattices.

The textured active layer may be in the form of a doped or undoped double heterostructure, a single quantum well or multiple quantum wells.

The textured n-cladding and contact layer may be in the form of single layer, multiple layers or superlattices.

A conducting substrate could comprise GaN, AlN, SiC, Si, GaAs, InP, ZnSe or other metal oxide material.

An insulating substrate could comprise sapphire, AlN, GaN, ZnO or other metal oxide material.

This invention enables an LED design with a three dimensional (3D) convex textured or trenched LED structure. Arrays of triangular, hexagonal, convex, concave or trapezoidal shaped LED structures increase its fill factor to more than one as the result of the enlarged active light emitting area by the 3D texture. At the same time, the textured surface breaks down internal reflection of the device and reduces the absorption distance of compound semiconductors and their alloys so that the light extraction efficiency can be significantly improved.

DETAILED DESCRIPTION OF PREFERRED EMBODIMENTS

Figure 1A:
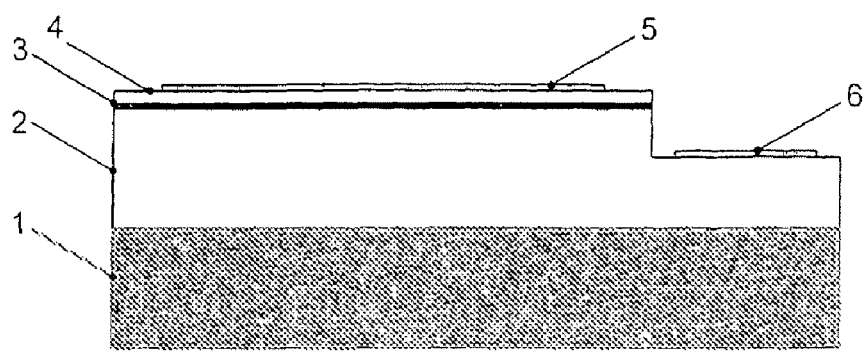
FIGS. 1a and 1b are schematic diagrams exhibiting the structure of a prior art LED structure on an insulating substrate and a conducting substrate respectively.
Figure 1B:
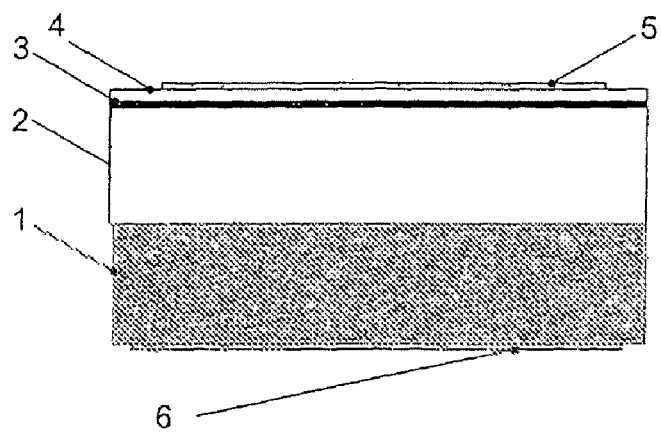

FIG. 1 (a) is a schematic drawing of a conventional planar LED structure with an n-type compound semiconductor layer 2 grown on an insulating substrate 1, there being quantum wells or a double hetero-structure active layer 3 deposited on top of the n-type contact layer 2 and a p-type contact layer 4 deposited on top of the active layer 3. A p-contact electrode 5 is fabricated on top of the p-type contact layer 4 and an n-contact electrode 6 is deposited on the n-contact layer 3 etched down by dry or wet etching process. FIG. 1 (b) shows a similar planar LED structure on conducting n-type substrate 1 with the n-contact electrode 6 as a bottom contact fabricated on the n-type substrate 1.

Examples of the invention use a patterned compound semiconductor as a substrate for conducting epitaxial overgrowth to form textured n-type cladding and contact layers, active layers and p-type cladding and contact layers. The patterned compound semiconductor can be prepared by metal organic chemical vapor deposition (MOCVD), hydride vapor epitaxy (HVPE), molecular beam epitaxy (MBE), the Czochralski method, sublimation, a hydrothermal technique, sputtering or other suitable deposition techniques combined with lithography. Mask or maskless lithography techniques can be used for the patterning. The compound semiconductor substrate used for patterning can be a compound semiconductor grown homoepitaxially or heteroepitaxially onto a conducting or insulating substrate, which can be any of Si, GaAs, InP, SiC, GaN, AlN, ZnSe and other metal oxide based materials. The epitaxy lateral overgrowth can be performed by MOCVD, HVPE or other suitable deposition techniques. The cross-section of the epitaxial grown full LED structure can be triangular, polygonal, trapezoidal, convex or concave shapes. Such III-V and III-VI compound semiconductor based textured high fill factor LEDs will be described using the following examples.

Example 1

Figure 2:
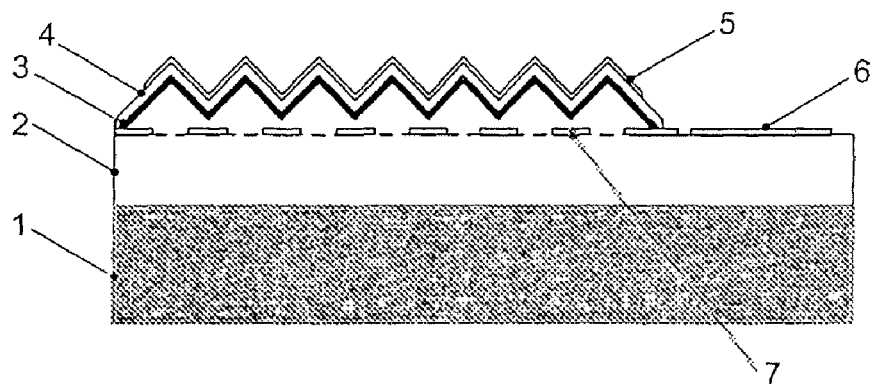
FIG. 2 is a schematic diagram exhibiting the stricture of an example of an LED according to the present invention on an insulating substrate.

FIG. 2 shows a III-V nitride LED structure. An SiO$_2$ mask along the <11-00> or <112-0> direction of GaN grown on a sapphire (Al$_2$O$_3$) substrate was used to photolithographically fabricate 2 μm window openings and 2 μm masked areas 7. 2-3 μm thickness GaN on can be deposited by hydride vapor phase epitaxy (HVPE) or by metal organic chemical vapor deposition (MOCVD). An n-cladding and contact layer 2 was deposited by epitaxial lateral overgrowth and made of 1-3 μm thick n-GaN doped by silicon (Si) with a doping level of $5 \times 10^{17}$-$10^{19}$ cm$^{-3}$. A triangular shaped n-contact layer was obtained due to the lateral epitaxial over growth mechanism. On this layer the active layer 3 was epitaxially grown and is made of 2.5-50 nm thick undoped or doped single or multiple quantum wells consisting of In$_x$Ga$_{1-x}$N wells with $0.05 < x < 0.5$ and In$_y$Ga$_{1-y}$N barriers with $0 \leq y \leq 0.05$. An ~0.5 μm thick hole emitting layer 4 is made of p-GaN doped with magnesium (Mg) at a concentration of $8 \times 10^{16}$-$10^{19}$ cm$^{-3}$. On the p-GaN hole emitting layer a metallic ohmic contact 5 was deposited. An n-type metallic contact 6 was deposited on the n-type contact layer 2 and etched down by dry etching using chlorine based reactive gases.

Figure 3:
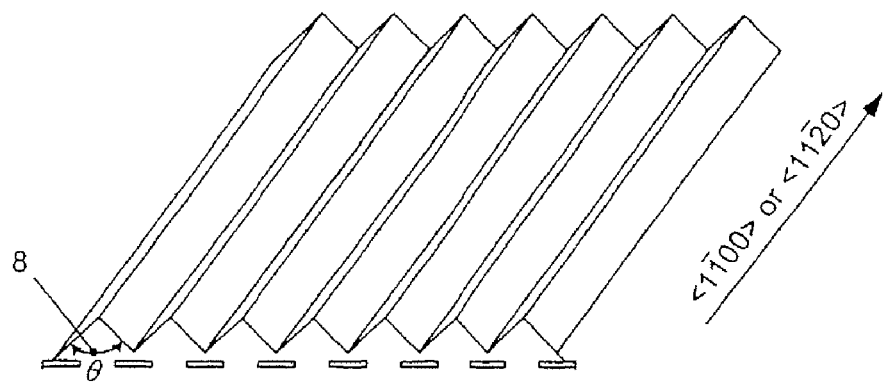
FIG. 3 is a schematic diagram exhibiting the cross-section of triangular LED structure with a fill factor larger than one.

The length of the active layer 3 along the <11-00> or <112-0> direction has not changed, but FIG. 3 (in which θ indicates the angle of θ of the triangular apex) shows that the length of the active layer 3 perpendicular to the <11-00> or <112-0> direction has increased by a factor of $1/\sin(\theta/2)$. Typically, the angle of the triangular apex is close to 60° and therefore a two-times increase in the area of active layer can be achieved. With 30% of the area used for the n-type contact, a 1.4 fill factor for the active layer can still be obtained.

Example 2

Figure 4:
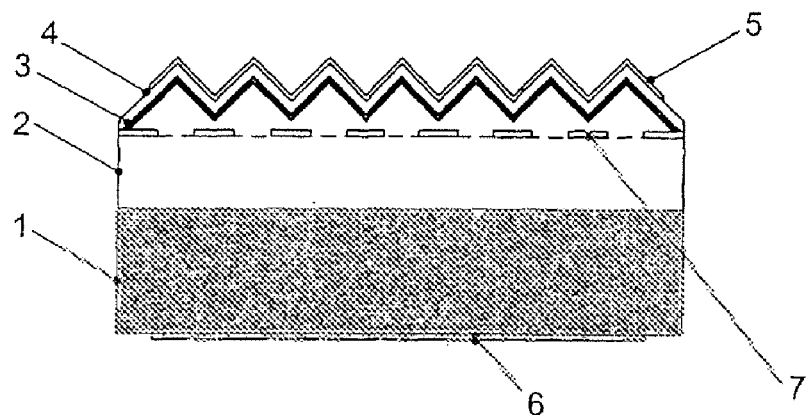
FIG. 4 is a diagram exhibiting the structure of an example of an LED according to the present invention on a conducting substrate.

FIG. 4 shows a III-V nitride LED structure similar to FIG. 2 except that the substrate is made of conducting material such as free-standing n-GaN, 4H—SiC or 6H—SiC. An n-type metallic contact 6 is deposited directly on the n-type contact layer 2. With no loss for the n-type contact, a fill factor 2 for the active layer can be obtained.

Example 3

Figure 5:
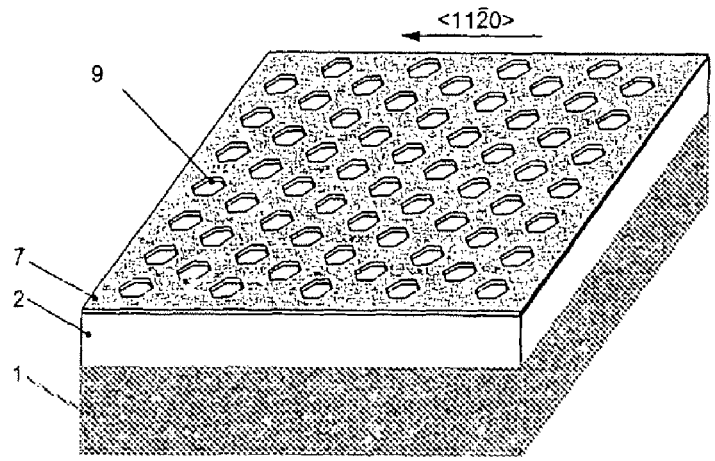
FIG. 5 is a diagram exhibiting a hexagonal mask with hexagonal window openings in an SiO$_2$ mask deposited on a GaN template.

FIG. 5 shows an $SiO_2$ masked area 7 with hexagonal window openings 9. The epitaxy lateral overgrowth of the III-V nitride layers in the hexagonal openings forms a hexagonal pyramid type of 3D LED structure. An n-type metallic contact 6 is deposited on the etched down n-contact layer with an insulating substrate. With a 30% loss for the n-type contact, a fill factor more than 1.9 for the active layer can be obtained.

Example 4

Figure 6:
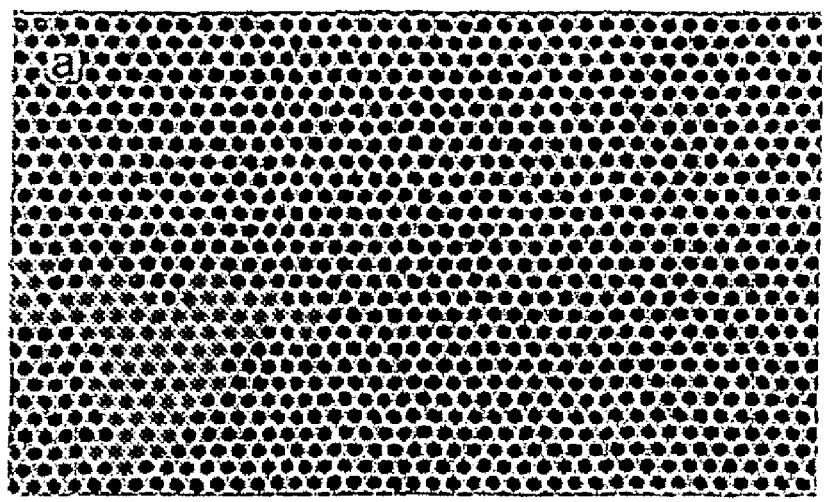
FIG. 6 shows a hexagonal nanohole mask with hexagonal nanohole window openings in an anodic porous alumina mask.

FIG. 6 shows a mask with highly ordered and closely packed hexagonal openings made of anodic porous alumina. In the case of GaN based devices, the opposite corners of the hexagonal openings are aligned with the <11-00> or <112-0> direction of the (0001) GaN. In the case of GaAs based devices, the opposite corners of the hexagonal openings are aligned within 10° of the <110> direction of the (001) n-GaAs and the same is true for AlInGaP based devices on GaAs. In the case of ZnSe based devices, the opposite corners of the hexagonal openings are aligned within 15° of the <112> direction of the (111) n-GaAs. The dimension of the hexagonal openings can be accurately controlled by the anodizing voltage in the anodizing process. This mask can be used in Example 3 for the epitaxy lateral overgrowth and fabrication of a hexagonally textured LED structure.

Example 5

Figure 7:
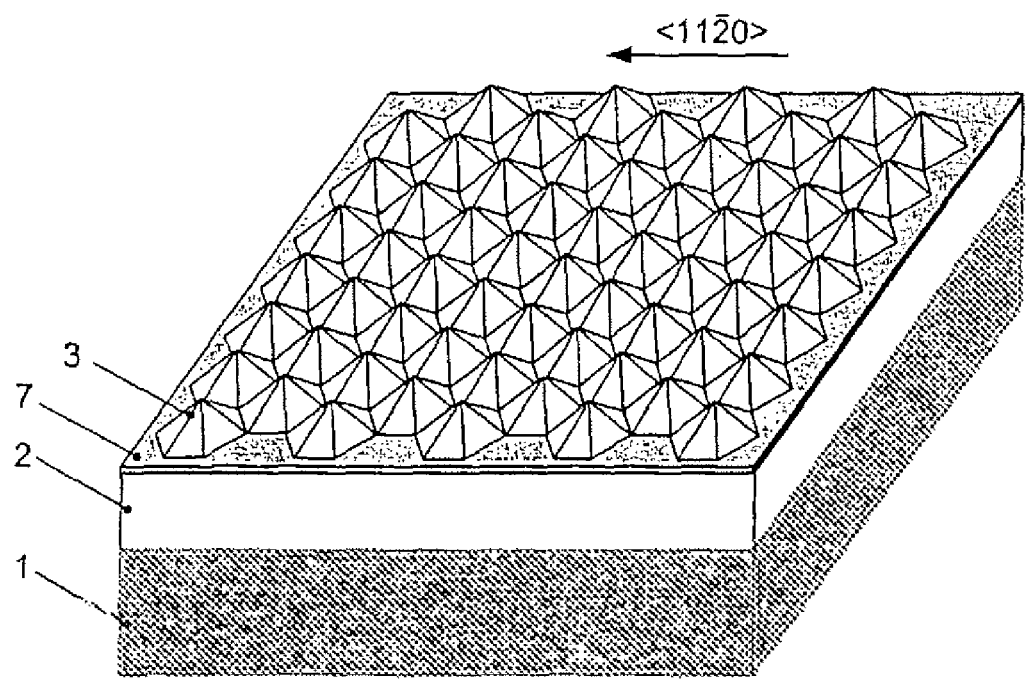
FIG. 7 is a schematic diagram exhibiting hexagonal GaN grown on top of a GaN template and SiO$_2$ mask using an epitaxial lateral overgrowth method.

FIG. 7 shows a highly ordered and closely packed hexagonal pyramidal shape of GaN grown by epitaxy lateral overgrowth on top of GaN, AlN, sapphire SiC or other non-nitride material. The mask with hexagonal openings can be made using normal photolithography or anodic porous alumina.

Example 6

Figure 8:
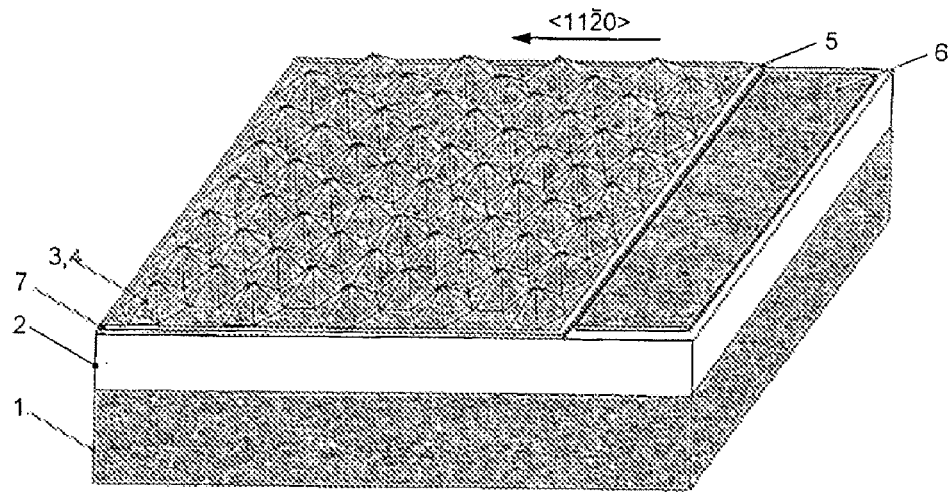
FIG. 8 is a schematic diagram exhibiting the hexagonal pyramidal structure according to an example of a textured LED structure according to the present invention on an insulating substrate.

FIG. 8 shows a highly ordered and closely packed hexagonal pyramidal shape GaN LED structure similar to FIG. 2 with an insulating substrate.

Example 7

Figure 9:
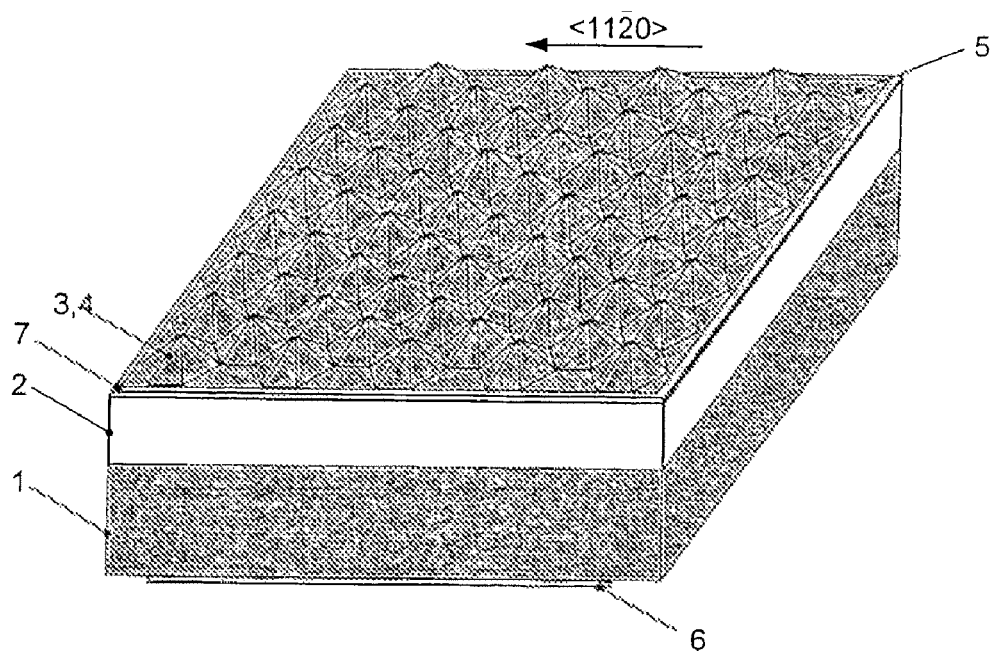
FIG. 9 is a schematic diagram exhibiting the hexagonal pyramidal structure according to an example of a textured LED structure according to the present invention on a conducting substrate.

FIG. 9 shows a highly ordered and closely packed hexagonal pyramidal shape GaN LED structure similar to FIG. 4 with a conducting substrate.

Example 8

A textured LED structure with a high fill factor similar to FIG. 4 can be made of 0.3 to 1 μm thick n-type $(Al_xGa_{1-x})_{0.5}In_{0.5}P$ with $0.5 \leq x \leq 1$ and a doping level of $5 \times 10^{17}$-$10^{19}$ $cm^{-3}$, a multiple quantum well active layer of <1 μm thick $(Al_xGa_{1-x})_{1-y}In_yP/(Al_{x1}Ga_{1-x})_{1-y1}In_{y1}P$ with $0.5 \leq x \leq 1$, $0.4 \leq y \leq 0.6$, and $0 \leq x1 \leq 0.4$, $0 \leq y1 \leq 0.4$ and a hole emitting and contact layer of p-type $(Al_xGa_{1-x})_{0.5}In_{0.5}P$ with $0.5 \leq x \leq 1$ and a doping level of $5 \times 10^{16}$ to $5 \times 10^{18}$ $cm^{-3}$. The substrate used for patterning and epitaxial lateral growth is n-type (001) GaAs.

Example 9

A textured LED structure with a high fill factor similar to FIG. 4 can be made of 0.3 to 1 μm thick n-type ZnSe or ZnMgSSe with a doping level of $5 \times 10^{17}$-$10^{19}$ $cm^{-3}$, a multiple quantum well active layer of <1 μm thick ZnCdSe/ZnSe, a hole emitting layer and contact layers of p-type ZnSe, ZnMgSSe, ZnTe/ZnSe multiple quantum well. The substrate used for patterning and epitaxial lateral growth is n-type (111) GaAs or n-type (100) ZnSe.

The invention claimed is:

1. A high fill factor textured light emitting diode structure comprising:
    a first textured cladding and contact layer comprising a doped III-V or II-VI group compound semiconductor or alloys of such semiconductors deposited by epitaxial lateral overgrowth (ELOG) onto a substrate patterned with a plurality of regions from which said overgrowth is initiated such that said first textured cladding and said contact layer are continuous over said substrate;
    a textured undoped or doped active layer comprising a III-V or II-VI group semiconductor or alloys of such semiconductors and where radiative recombination of electrons and holes occurs or intersubband transition occurs, the active layer being continuous over said first textured cladding and contact layer; and
    a second textured cladding and contact layer comprising a doped III-V or II-VI group compound semiconductor or alloys of such semiconductors.

2. A structure according to claim 1, comprising:
    a conducting or insulating substrate;
    a III-V or II-VI group compound semiconductor or alloys of such semiconductors deposited onto the substrate by HVPE, MOCVD, MBE, LPE, sublimation, sputtering or other appropriate deposition method; and
    a pattern on the substrate produced by a mask or maskless method comprising photolithography, direct writing using an electron beam or a focused ion beam, scanning tunneling microscopy, holography, nanoimprint, anodic porous alumina, wet etching or other patterning method or combined method.

3. A structure according to claim 1, wherein the or each textured cladding and contact layer is in the form of a single layer, multiple layers or superlattices.

4. A structure according to claim 1, wherein the textured active layer is in the form of a doped or undoped double heterostructure, a single quantum well or multiple quantum wells.

5. A structure according to claim 1, wherein the substrate is conducting and comprises GaN, AlN, SiC, Si, GaAs, InP, ZnSe or other metal oxide material.

6. A structure according to claim 1, wherein the substrate is insulating and comprises sapphire, AlN, GaN, ZnO or other metal oxide material.

7. A high fill factor textured light emitting diode structure comprising:
    a textured n-cladding and contact layer comprising an n-type III-V or II-VI group compound semiconductor or alloys of such semiconductors deposited by epitaxial lateral overgrowth (ELOG) onto a substrate patterned with a plurality of regions from which said overgrowth is initiated such that said first textured cladding and said contact layer are continuous over said substrate;
    a textured active layer comprising a III-V or II-VI group semiconductor or alloys of such semiconductors and where radiative recombination of electrons and holes occurs, the active layer being continuous over said first textured n-cladding and contact layer; and
    a textured hole emitting layer and p-type contact layer comprising a p-type III-V or II-VI group semiconductor or alloys of such semiconductors.

8. A structure according to claim 7, comprising:
a conducting or insulating substrate;
a III-V or II-VI group compound semiconductor or alloys of such semiconductors deposited onto the substrate by HVPE, MOCVD, MBE, LPE, sublimation, sputtering or other appropriate deposition method; and
a pattern on the substrate produced by a mask or maskless method comprising photolithography, direct writing using an electron beam or a focused ion beam, scanning tunneling microscopy, holography, nanoimprint, anodic porous alumina, wet etching or other patterning method or combined method.

9. A structure according to claim 7, wherein the textured hole emitting layer and p-type contact layer is in the form of a single layer, multiple layers or superlattices.

10. A structure according to claim 7, wherein the textured active layer is in the form of a doped or undoped double heterostructure, a single quantum well or multiple quantum wells.

11. A structure according to claim 7, wherein the textured n-cladding and contact layer is in the form of single layer, multiple layers or superlattices.

12. A structure according to claim 7, wherein the substrate is conducting and comprises GaN, AlN, SiC, Si, GaAs, InP, ZnSe or other metal oxide material.

13. A structure according to claim 7, wherein the substrate is insulating and comprises sapphire, AlN, GaN, ZnO or other metal oxide material.

* * * * *